US007039844B2

(12) United States Patent
Hapke

(10) Patent No.: US 7,039,844 B2
(45) Date of Patent: May 2, 2006

(54) INTEGRATED CIRCUIT WITH SELF-TESTING CIRCUIT

(75) Inventor: Friedrich Hapke, Winsen/Luhe (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/501,796

(22) PCT Filed: Jan. 14, 2003

(86) PCT No.: PCT/IB03/00053

§ 371 (c)(1),
(2), (4) Date: Jul. 16, 2004

(87) PCT Pub. No.: WO03/060534

PCT Pub. Date: Jul. 24, 2003

(65) Prior Publication Data
US 2005/0050420 A1    Mar. 3, 2005

(30) Foreign Application Priority Data
Jan. 17, 2002    (DE)    ................................ 102 01 554

(51) Int. Cl.
*G01R 31/28*    (2006.01)
(52) U.S. Cl. ........................................ 714/733; 714/732
(58) Field of Classification Search .................... None
See application file for complete search history.

(56) References Cited

U.S. PATENT DOCUMENTS 5,574,733 A * 11/1996 Kim ............................ 714/728
5,831,992 A * 11/1998 Wu ............................. 714/732
6,370,664 B1 * 4/2002 Bhawmik ................... 714/729

FOREIGN PATENT DOCUMENTS

EP    1 178 322    2/2002
WO    WO 01 038889    5/2001

OTHER PUBLICATIONS

Kiefer, G, et al. "Using Bist Control for Pattern Generation" Proceedings of the International Test Conf. ITC '97. Washington, DC No. 1-6, 1997, International Test Conf., New York, NY: IEEE, US, vol. Conf. 28, Nov. 1, 1997.

* cited by examiner

*Primary Examiner*—Christine T. Tu

(57) ABSTRACT

An integrated circuit (14) with an application circuit (1) to be tested and a self-testing circuit (5-13), which is provided for testing the application circuit (1) and generates pseudo-random test patterns, which can be transformed, by means of first logic gates (6, 7, 8) and signals externally fed to said gates, into deterministic test vectors, which are fed to the application circuit (1) for testing purposes, wherein the output signals occurring through the application circuit (1) as a function of the test patterns are evaluated by means of a signature register (13), wherein, by means of second logic gates (10, 11, 12) and signals fed to said gates, those bits of the output signals of the application circuit (1) which, due to the circuit structure of application circuit (1), have undefined states, are blocked during testing.

13 Claims, 1 Drawing Sheet

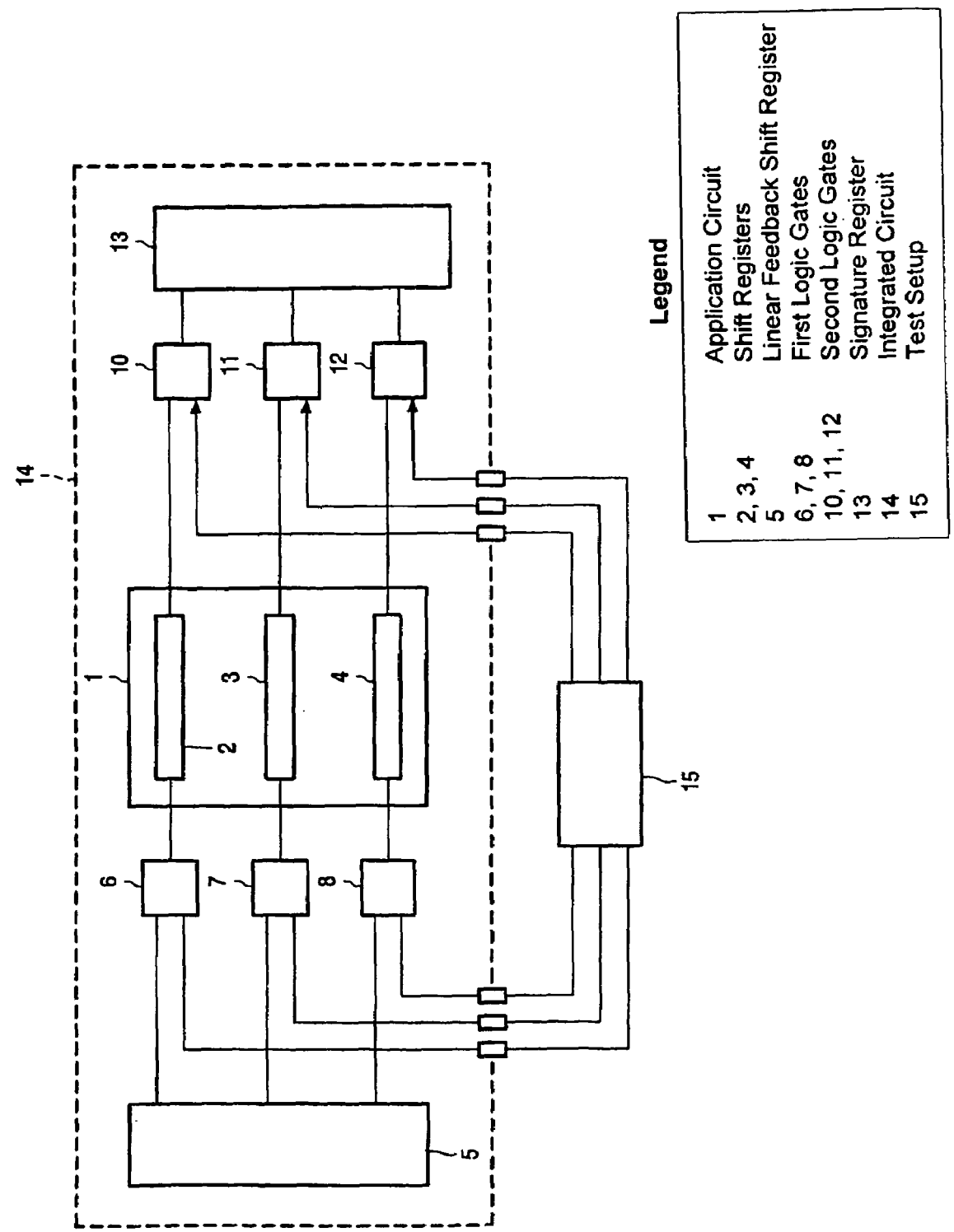

INTEGRATED CIRCUIT WITH SELF-TESTING CIRCUIT

The invention relates to an integrated circuit with an application circuit to be tested and a self-testing circuit which is provided for testing the application circuit.

In creating integrated circuits, there is a quite general desire to check these as regards their operation. Tests of this kind may be undertaken by external test setups. Due to the very high integration density of circuits of this kind, the very high clock-pulse rates at which these circuits operate and the very great number of test vectors required, many problems and costs arise with the external test. The high internal clock-pulse rates of the integrated circuits are out of all proportion with the comparatively very slow input/output bonding pad stages, which lead to the outside. The possibility of performing a kind of self-testing of the integrated circuit is therefore desirable. Here, a self-testing circuit is provided within the integrated circuit, which serves to test the application circuit also provided in the integrated circuit. The application circuit represents the circuit that is provided for the actual intended purpose of the integrated circuit.

A further problem encountered in testing circuits of this kind is that problems occur with those components within the circuit that produce a so-called "X" during testing, i.e. a signal that cannot be clearly evaluated. Signals of this kind are produced by, in particular, those components that exhibit analog or storage properties.

For example, RAMs which are provided within the application circuit may produce random output signals. Signals produced by a RAM of this kind and propagated through the circuit can thereby no longer be unambiguously evaluated at the circuit output during testing.

In order to circumvent these problems, the provision of special components within the circuit to permit components of this kind to be bypassed or the outputs of these components to be masked during testing, is known from the prior art. The disadvantage here is that additional components have to be provided within the circuit, resulting, on the one hand, in an increased outlay, and, on the other, in a special circuit design, which may occasion disadvantages.

An integrated circuit with an application circuit to be tested and a self-testing circuit, which supplies deterministic test patterns, is known from the publication "Using BIST control for pattern generation" by Gundolf Kiefer and Hans-Joachim Wunderlich (published in Proceedings, International Test Conference 1997). This is achieved by providing, in addition to a test-pattern generator, which is a feedback shift register supplying pseudorandom patterns, a logic circuit which alters the output signal of this test-pattern generator in such a way that certain deterministic test patterns occur. It can thereby be achieved that the circuit can be tested with test patterns that can be predefined, and not just with ones which are defined on a quasi-random basis by the test-pattern generator.

It is an object of the invention to further-develop the integrated circuit cited above to the effect that a test of the application circuit with deterministic test patterns is possible, and that simultaneously, X signals occurring within the circuit during testing do not distort the test results, whereby no additional components are to be provided within the application circuit.

This object is achieved according to the invention by the features as claimed in claim 1:

An integrated circuit with an application circuit to be tested and a self-testing circuit, which is provided for testing the application circuit and generates pseudorandom test patterns, which can be transformed, by means of first logic gates and signals externally fed to said gates, into deterministic test vectors, which are fed to the application circuit for testing purposes, wherein the output signals occurring through the application circuit as a function of the test patterns are evaluated by means of a signature register, wherein, by means of second logic gates and signals externally fed to said gates, those bits of the output signals of the application circuit which, due to the circuit structure of the application circuit, have undefined states, are blocked during testing.

Initially, the pseudorandom test patterns generated by the self-testing circuit are not suitable as test vectors. Rather, they are transformed into the desired deterministic test vectors by means of first logic gates. This is possible by means of signals externally fed to the first gates, which are designed in such a way that, through the combination of the pseudorandom test patterns and the signals fed in externally, the desired deterministic test vectors are obtained by means of the first logic gates.

These test patterns are fed to the application circuit, which alters the test vectors due to the design of the application circuit. The output signals of the application circuit arising as a result during testing are coupled to the signature register via second logic gates. The signature register combines these output signals arising from multiple test cycles to form an overall final result, which represents a type of signature and which indicates whether the circuit is operating free from faults.

With this procedure, however, problems occur when components that are almost always provided in the application circuit, which exhibit analog or storage properties, influence the output signals of the application circuit during testing. So-called X signals, which deliver a "Don't care" result, then occur. In other words, signals marked with an X of this kind are random and therefore cannot be evaluated. As a result, values that likewise cannot be evaluated arise for signals of this kind in the feedback shift register. This is to be avoided.

This is achieved according to the invention in that, by means of the second logic gates and signals externally fed to these gates, all the bits in the output signals of the application circuit potentially containing X signals of this kind are blocked. So all those bits that are influenced by storage or analog properties of components within the application circuit are not passed on to the signature shift register. Only the remaining bits, which are not influenced by components of this kind, are connected through to the signature register by means of the second logic gates.

It is thereby ensured that those bits which reach the signature register during testing can be evaluated. In turn, this means that the signature result present in the feedback shift register after multiple test cycles have been run can be fully evaluated, and supplies a reliable test result.

One important advantage of the integrated circuit with self-testing circuit according to the invention consists in the fact that the application circuit does not have to be modified for the test procedures, i.e. it can be designed in a way that is optimal for the use of the application circuit. The self-testing circuit in no way influences the normal operating mode of the application circuit in its use.

Furthermore, the self-testing circuit according to the invention enables a test of the application circuit to be undertaken on the chip, so that relatively slow output bonding pad connections do not interfere with the testing, and the operation of the application circuit can be undertaken with maximum clock rates of the input bonding pads.

The self-testing circuit provided on the integrated circuit is of a very simple design and itself requires little space. The deterministic test vectors may still be amended even after the ICs have been produced.

According to one embodiment of the invention as claimed in claim 2, a linear feedback shift register provided in the self-testing circuit serves for generating the pseudorandom test patterns, which are thereby known and can be transformed into the desired deterministic test vectors by means of the first logic gates.

The invention will be further described with reference to an example of an embodiment shown in the drawing, to which, however, the invention is not limited.

The FIGURE shows, in a schematic block diagram, an integrated circuit 14, which is equipped with an application circuit 1. This application circuit 1 is the circuit which is designed for the use of the integrated circuit 14.

Following production of the integrated circuit 14, there is a desire to test the application circuit 1 for satisfactory operation. To this end, a self-testing circuit, consisting of circuit elements 5 to 13 as shown in the FIGURE, is provided on integrated circuit 14.

In the integrated circuit 14 according to the invention, this self-testing circuit is designed in such a way that it is assembled entirely outside the application circuit 1, and so that its behavior does not exert an influence in normal operation.

In the embodiment shown in the FIGURE, it is assumed that the application circuit 1 is equipped with three circuit chains 2, 3 and 4, which are shift registers. Further shift registers may also be provided. Furthermore, further circuit elements may be provided.

Within the self-testing circuit, a linear feedback shift register 5 is provided, which supplies a pseudorandom sequence of test patterns. Since the shift register 5 is fed back and has only a finite length, this test-pattern sequence is not truly random; it exhibits a pattern which repeats itself after specific intervals. However, this test-pattern sequence has the disadvantage that it does not fully contain all test patterns that are optimal for testing application circuit 1.

Logic gates 6, 7 and 8 are therefore provided, which alter the output signals of the linear feedback shift register 5 in such a way that, at the outputs of the first logic gates 6, 7 and 8, and thereby at the inputs of application circuit 1, or its circuit chains 2, 3 or 4, test patterns having a deterministic structure than can be predefined are produced. This is achieved in that signals are fed to the first logic gates 6, 7 and 8 from a test setup 15 provided outside the integrated circuit, by means of which signals the first logic gates 6, 7 and 8 modify individual bits of the test patterns supplied by the linear feedback shift register 5 in such a way that desired, deterministic test patterns arise. The externally provided test setup is required only during testing of the integrated circuit; in normal operation of the integrated circuit, it is not present.

In the embodiment shown in the FIGURE, the test vectors are fed to circuit chains 2, 3 and 4 within application circuit 1.

On the basis of these test patterns, circuits chains 2, 3 and 4 supply output signals within application circuit 1, which output signals reach a signature register 13 via second logic gates 10, 11 and 12.

The signature register 13 is designed in such a way that it undertakes a combination of the test results over multiple test cycles, each containing a test pattern, and, following the test run, supplies a so-called signature, which has to exhibit a specific, predefined value if application circuit 1 is operating free from faults.

Here, the problem exists, however, that circuit elements may be provided (and generally are, in fact) in application circuit 1 or within its circuit chains 2, 3 and/or 4, which circuit elements exhibit analog or storage properties. Circuit elements of this kind do not supply an unambiguous output signal, i.e. as a function of the input signal fed to them, they do not supply a deterministic output signal. Rather, their output signal is random. It is clear that signals of this kind do not just distort the test result, but also render specific bits within the test result unusable.

In order, nevertheless, to be able to undertake testing of application circuit 1, using the simplest possible setup, even with components of this kind, second logic gates 10, 11 and 12 are provided in the circuit according to the invention, which second logic gates are capable, as a function of signals generated by the external test setup 15, of blocking individual bits of the signals supplied by circuit chains 2, 3 and 4 during testing, so that only those bits which are not influenced by components with storage and analog properties reach the signature register 13 during testing.

As a result, only those bits that can be unambiguously evaluated and supply an unambiguous result reach signature register 13. So, even if application circuit 1 is equipped with components exhibiting storage or analog properties, an unambiguous signature can be generated in signature register 13 at the end of testing, which indicates an error-free test result.

The external test setup 15 may be a conventional test setup, which here, however, does not itself supply the test vectors, and nor does it undertake any evaluation, but supplies signals such that, within the self-testing circuit provided on the integrated circuit, the desired test vectors are generated from the pseudorandom sequence of numbers, and the bits that cannot be evaluated are extracted from the output signals of the circuit 1 under test.

Overall, by virtue of the self-testing circuit according to the invention, testing of application circuit 1 on the chip becomes possible without any restrictions arising as a result. No modification of application circuit 1 is necessary, so it can be optimally designed for its actual operation. All test procedures are also possible without restriction for those application circuits equipped with components exhibiting storage or analog properties. The desired, deterministic test vectors can still be amended, even after production of the integrated circuit.

The invention claimed is:

1. An integrated circuit comprising;
    a test circuit that generates deterministic test vectors;
    an application circuit coupled to receive and process the deterministic test vectors to produce output signals;
    a logic gate coupled to receive the output signals and block X signal portions of the output signals in response to a first signal and output the remainder of the output signals; and
    a signature register coupled to receive the remainder of the output signals and generate a signature.

2. The integrated circuit of claim 1 wherein the X signal comprises an ambiguous signal.

3. The integrated circuit of claim 2 wherein the X signal is ambiguous due to influence by a circuit element in the application circuit which exhibits a storage property.

4. The integrated circuit of claim 2 wherein the X signal is ambiguous due to influence by a circuit element in the application circuit which exhibits an analog behavior.

5. The integrated circuit of claim 1 wherein the test circuit comprises
a test pattern generator for generating pseudorandom test patterns; and
a second logic gate for receiving the pseudorandom test patterns and modifying the pseudorandom test patterns into a deterministic test patterns in response to a second signal.

6. The integrated circuit of claim 5 wherein the second signal is received from a source external to the integrated circuit.

7. The integrated circuit of claim 5 wherein the test pattern generator is a linear feedback shift register.

8. The integrated circuit of claim 1 wherein the first signal is received from a source external to the integrated circuit.

9. An integrated circuit comprising;
means for generating deterministic test vectors;
means for receiving and processing the deterministic test vectors to produce an output signal;
means for receiving the output signals and a first signal and blocking X signal portions of the output signals in response to the first signal and outputting the remainder of the output signals; and
means for receiving the remainder of the output signals and generating a signature.

10. The integrated circuit of claim 9 wherein the signature indicates if the application circuit is operating correctly.

11. The integrated circuit of claim 9 wherein the X signal comprises an ambiguous signal.

12. The integrated circuit of claim 11 wherein the X signal is ambiguous due to influence by a circuit element in the application circuit which exhibits a storage property.

13. The integrated circuit of claim 11 wherein the X signal is ambiguous due to influence by a circuit element in the application circuit which exhibits an analog behavior.

* * * * *